(12) United States Patent
Lee et al.

(10) Patent No.: US 11,072,257 B2
(45) Date of Patent: Jul. 27, 2021

(54) SWITCH CONTROL APPARATUS

(71) Applicant: LG Chem, Ltd., Seoul (KR)

(72) Inventors: Jun-Hyok Lee, Daejeon (KR); Seok-Jun Lee, Daejeon (KR)

(73) Assignee: LG Chem, Ltd.

( * ) Notice: Subject to any disclaimer, the term of this patent is extended or adjusted under 35 U.S.C. 154(b) by 0 days.

(21) Appl. No.: 16/961,978

(22) PCT Filed: Aug. 13, 2019

(86) PCT No.: PCT/KR2019/010333
§ 371 (c)(1),
(2) Date: Jul. 14, 2020

(87) PCT Pub. No.: WO2020/036427
PCT Pub. Date: Feb. 20, 2020

(65) Prior Publication Data
US 2021/0078437 A1 Mar. 18, 2021

(30) Foreign Application Priority Data

Aug. 13, 2018 (KR) .................. 10-2018-0094441

(51) Int. Cl.
*H02B 1/24* (2006.01)
*B60L 58/10* (2019.01)
*B60L 50/60* (2019.01)

(52) U.S. Cl.
CPC ............. *B60L 58/10* (2019.02); *B60L 50/60* (2019.02)

(58) Field of Classification Search
CPC ..................................... B60L 58/10
USPC ........................................ 307/112
See application file for complete search history.

(56) References Cited

U.S. PATENT DOCUMENTS

| 6,657,839 B2 | 12/2003 | de Oliveira |
| 2003/0193770 A1 | 10/2003 | Chung |
| 2015/0256070 A1 | 9/2015 | Lee et al. |
| 2016/0308523 A1 | 10/2016 | Otake et al. |

FOREIGN PATENT DOCUMENTS

| JP | 2001270401 A | 10/2001 |
| JP | 2005029020 A | 2/2005 |
| JP | 5084526 B2 | 11/2012 |
| KR | 100264146 B1 | 8/2000 |
| KR | 100434153 B1 | 6/2004 |
| KR | 101031586 B1 | 4/2011 |
| KR | 20140055986 A | 5/2014 |
| KR | 20160029931 A | 3/2016 |

(Continued)

OTHER PUBLICATIONS

International Search Report for Application No. PCT/KR2019/010333, dated Nov. 27, 2019, pp. 1-2.

*Primary Examiner* — Daniel Cavallari
*Assistant Examiner* — Dru Parries
(74) *Attorney, Agent, or Firm* — Lerner, David, Littenberg, Krumholz & Mentlik, LLP

(57) ABSTRACT

A switch control apparatus capable of effectively controlling a switch during a process of controlling the switch provided in a battery pack. When the switch is shifted from a closed state to an open state, the current caused by the generated counter electromotive force is quickly released, thereby quickly shifting the switch to turn on or off. In addition, since the voltage applied to the control unit falls within the rated voltage range, the stability of the switch control circuit may be enhanced.

10 Claims, 3 Drawing Sheets

(56) References Cited

FOREIGN PATENT DOCUMENTS

| KR | 20170029999 A | 3/2017 |
|----|---------------|--------|
| KR | 20180026947 A | 3/2018 |
| KR | 20180049899 A | 5/2018 |

SWITCH CONTROL APPARATUS

CROSS-REFERENCE TO RELATED APPLICATIONS

The present application is a national phase entry under 35 U.S.C. § 371 of International Application No. PCT/KR2019/010333 filed Aug. 13, 2019, published in Korean, which claims priority from Korean Patent Application 10-2018-0094441 filed Aug. 13, 2018, all of which are incorporated herein by reference.

TECHNICAL FIELD

The present disclosure relates to a switch control apparatus, and more particularly, to a switch control apparatus capable of effectively controlling a switch during a process of controlling the switch provided in a battery pack.

BACKGROUND ART

In recent years, the demand for portable electronic products such as notebook computers, video cameras and portable phones has increased sharply, and the energy storage batteries, robots and satellites has been active developed. Accordingly, high-performance secondary batteries allowing repeated charging and discharging are being actively studied.

Accordingly, as the technology development and demand for mobile devices, electric vehicles, hybrid electric vehicles, power storage systems and uninterruptible power devices increase, the demand for secondary batteries as energy sources is rapidly increasing. In particular, the secondary batteries used in electric vehicles or hybrid electric vehicles are high-power, high-capacity secondary batteries, and much research is being conducted on them.

In addition, along with the demand for secondary batteries, research on peripheral components and devices related to the secondary batteries is being conducted. That is, research is being conducted on various components and devices such as a battery module in which a plurality of secondary batteries are connected into a single module, a battery management system (BMS) for controlling charge and discharge of the battery module and monitoring the state of each secondary battery, a battery pack including the battery module and the BMS in a pack, and a contactor for connecting the battery module to a load such as a motor.

In particular, the contactor is a switch that connects the battery module and the load and controls whether or not to supply a power. As an example, the operating voltage of a lithium ion secondary battery widely used in the art is about 3.7V to 4.2V. In order to provide a high voltage, a plurality of secondary batteries are connected in series to configure a battery module. In case of a battery module used in an electric vehicle or a hybrid electric vehicle, the motor for driving the vehicle requires a battery voltage of approximately 240V to 280V. The contactor connecting the battery module and the motor is a component through which high-voltage, high-output electrical energy passes at all times, so it is important to monitor faults of the contactor and to effectively control to turn on/off the contactor.

SUMMARY

Technical Problem

The present disclosure is designed to solve the problems of the related art, and therefore the present disclosure is directed to providing an improved switch control apparatus, which may effectively control a switch during a process of controlling the switch provided in a battery pack.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a switch control apparatus for controlling an opening/closing operation of a switch supplied with a power from a voltage input source, the switch control apparatus comprising: a freewheeling diode electrically connected to the switch in parallel so that a current flows toward a positive electrode terminal of the switch; a Zener diode electrically connected to the freewheeling diode in series; a field effect transistor (FET) provided between an input terminal of the voltage input source and a positive electrode terminal of the switch and configured to receive an input voltage from the input terminal and transmit the input voltage to the positive electrode terminal of the switch; a control unit electrically connected to the FET to transmit a signal to the FET for controlling an opening/closing operation of the switch; and a resistor provided on a connection path between the control unit and the path along which the input voltage is supplied from the input terminal of the voltage input source to the switch, to distribute a voltage applied to the control unit.

The resistor may be electrically connected directly between a first input/output pin of the control unit and a node between a drain terminal of the FET and the positive electrode terminal of the switch.

The resistor may have a resistance so that a voltage applied to the first input/output pin of the control unit falls within a rated voltage range of the control unit.

The resistance of the resistor may be greater than or equal to an internal resistance of the control unit.

The Zener diode may be configured so that a forward direction thereof is opposite to a forward direction of the freewheeling diode.

The FET may be configured such that a source terminal of the FET is electrically connected to the input terminal directly, a drain terminal of the FET is electrically connected to the positive electrode terminal of the switch directly, and a gate terminal of the FET is electrically connected to the control unit directly.

The control unit may include at least two input/output pins, and the input/output pins may be electrically connected directly to the FET and the resistor, respectively.

The switch control apparatus according to another embodiment of the present disclosure may further comprise a reverse voltage protection diode connected between the control unit and the resistor and configured so that a forward direction thereof is a direction toward the resistor.

A battery management system (BMS) according to another embodiment of the present disclosure may comprise the switch control apparatus according to any of the embodiments of the present disclosure.

A battery pack according to another embodiment of the present disclosure may comprise the switch control apparatus according to any of the embodiments of the present disclosure.

Advantageous Effects

According to an aspect of the present disclosure, when the switch is shifted from a closed state to an open state, the current caused by the generated counter electromotive force is quickly released, thereby quickly shifting the switch to turn on or off.

In addition, according to an aspect of the present disclosure, since the voltage applied to the control unit falls within the rated voltage range, the stability of the switch control circuit may be enhanced.

The present disclosure may have various effects other than the above, and other effects of the present disclosure may be understood from the following description and more clearly figured out by the embodiments of the present disclosure.

BRIEF DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

In addition, in the present disclosure, if it is determined that a detailed description of a related known structure or function may obscure the subject matter of the present disclosure, the detailed description will be omitted.

Throughout the specification, when a portion is referred to as "comprising" or "including" any element, it means that the portion may include other elements further, without excluding other elements, unless specifically stated otherwise. Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

In the specification, a secondary battery means one independent cell that has a positive electrode terminal and a negative electrode terminal and is physically separable. For example, one pouch-type lithium polymer cell may be considered as a secondary battery. A switch control apparatus according to an embodiment of the present disclosure may be an apparatus for controlling an opening/closing operation of a switch supplied with a power from a voltage input source. Here, the switch control apparatus may be provided to a battery pack. In addition, the switch control apparatus may be provided to a battery pack mounted in a vehicle. For example, the voltage input source may be a voltage source that delivers an operating voltage for controlling the operation of the switch. For example, the voltage input source may be a 12V lead storage battery, and the switch may be a contactor or a relay.

Figure 1:
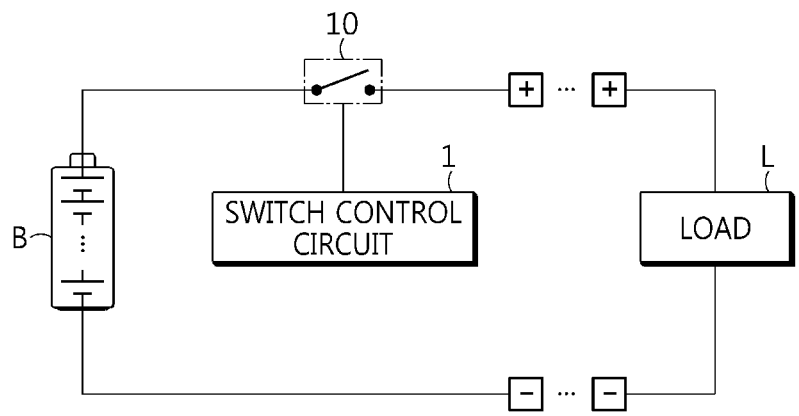
FIG. 1 is a diagram schematically showing that a switch control circuit according to an embodiment of the present disclosure is connected to a switch provided at a battery pack.
Figure 2:
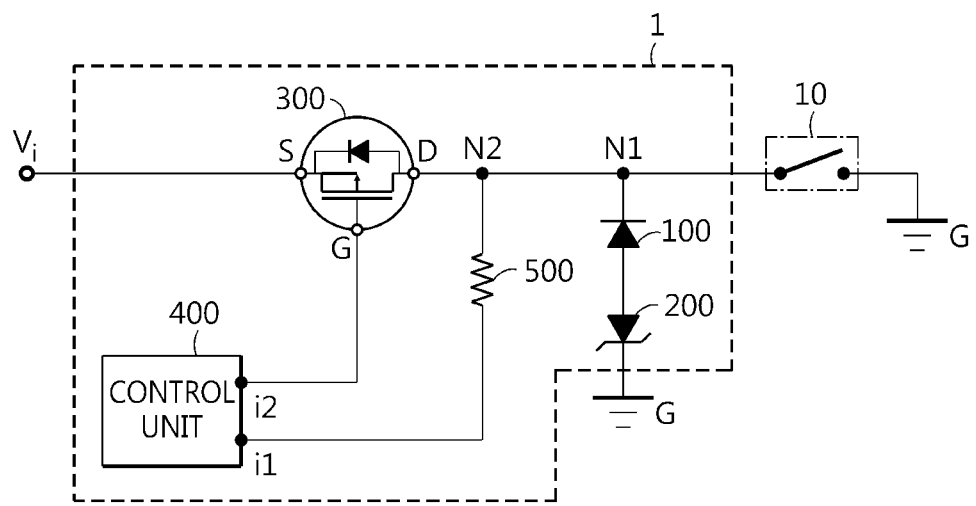
FIG. 2 is a diagram schematically showing that the switch control circuit according to an embodiment of the present disclosure is connected to the switch.

FIG. 1 is a diagram schematically showing that a switch control circuit according to an embodiment of the present disclosure is connected to a switch provided at a battery pack. FIG. 2 is a diagram schematically showing that the switch control circuit according to an embodiment of the present disclosure is connected to the switch.

Referring to FIGS. 1 and 2, the switch control apparatus according to an embodiment of the present disclosure may be included in a switch control circuit 1.

As shown in FIG. 1, the switch control circuit 1 according to an embodiment of the present disclosure may be a circuit for controlling a switch 10 provided between a positive electrode terminal of a cell assembly B including at least one secondary battery and a positive electrode terminal of a battery pack. The positive electrode terminal and the negative electrode terminal of the battery pack may be connected to a load L.

For example, if the battery pack according to an embodiment of the present disclosure is provided in a vehicle, both ends of the battery pack may be connected to a vehicle load.

As shown in FIG. 2, the switch control apparatus according to an embodiment of the present disclosure may include a freewheeling diode 100, a Zener diode 200, a field effect transistor (FET) 300, a control unit 400 and a resistor 500.

The freewheeling diode 100 may be electrically connected to the switch 10 in parallel. For example, as shown in FIG. 2, the freewheeling diode 100 may be provided between the ground G and a first node N1 provided on a connection path between an input terminal Vi and the switch 10. In addition, the freewheeling diode 100 may be electrically connected in parallel to the switch 10 having both ends connected to the first node N1 and the ground G.

Also, the freewheeling diode 100 may be configured to allow a current to flow toward the positive electrode terminal of the switch 10. For example, as shown in FIG. 2, the freewheeling diode 100 may be a diode configured to allow a current to flow toward the first node N1 while setting the direction toward the first node N1 as a forward direction. In addition, the freewheeling diode 100 may be configured such that a current flows toward the positive electrode terminal of the switch 10 through the first node N1.

In addition, if the switch 10 is shifted from a closed state to an open state, the freewheeling diode 100 may allow the current generated by an inductor component of the switch 10 to flow back to the switch 10 through a closed loop that connects the freewheeling diode 100 and the switch 10, thereby preventing the switch 10 from being damaged by an impulse voltage generated by a counter electromotive force.

The Zener diode 200 may be electrically connected to the freewheeling diode 100 in series. For example, as shown in FIG. 2, the Zener diode 200 may be provided between the first node N1 and the ground G and electrically connected to the freewheeling diode 100 in series.

In addition, the Zener diode 200 may be configured so that its forward direction is a direction toward the ground G. For example, as shown in FIG. 2, the Zener diode 200 may be configured so that a direction toward the first node N1 is a reverse direction and a direction toward the ground G is a forward direction.

Also, if a current flows toward the first node N1 through the freewheeling diode 100, the Zener diode 200 may allow a predetermined threshold voltage to be applied to the first node N1.

For example, if the switch 10 is shifted from the closed state to the open state, a counter electromotive force may be generated due to an electromagnet provided in the switch 10. In this case, the ground G connected to the Zener diode 200 may instantaneously have a higher potential than the first node N1. For example, −18V may be applied to the first node N1, relative to the ground G. Through this configuration, if the switch 10 is shifted from the closed state to the open state, the Zener diode 200 may allow a current to flow quickly through the closed loop that connects the freewheeling diode 100 and the switch 10. Thus, the current generated by the counter electromotive force of switch 10 may be released quickly.

The FET 300 may be provided between the input terminal Vi of the voltage input source and the positive electrode terminal of the switch 10. For example, as shown in FIG. 2, the FET 300 may be provided on a path connecting the input terminal Vi and the positive electrode terminal of the switch 10. For example, the FET 300 may be configured such that a source terminal S of the FET 300 is electrically connected directly to the input terminal Vi and a drain terminal D of the FET 300 is electrically connected directly to the switch 10.

In addition, the FET 300 may receive an input voltage from the input terminal Vi. For example, as shown in FIG. 2, the FET 300 may receive an input voltage from the input terminal Vi of the voltage input source to the source terminal S of the FET 300. For example, the voltage input source may be a voltage source provided in a battery management system (BMS). Preferably, the voltage input source may be a 12V lead storage battery provided in the BMS.

In addition, the FET 300 may be configured to transmit the input voltage input from the input terminal Vi of the voltage input source to the positive electrode terminal of the switch 10. For example, as shown in FIG. 2, the FET 300 may be configured to electrically connect the source terminal S of the FET 300 and the drain terminal D of the FET 300 to each other according to a signal applied to the gate terminal G of the FET 300. Thus, the FET 300 may transmit the input voltage from the source terminal S to the positive electrode terminal of the switch 10. For example, as shown in FIG. 2, the FET 300 may be a p-channel MOSFET (Metal Oxide Semiconductor Field Effect Transistor) having a parasitic diode.

The control unit 400 may be electrically connected to the FET 300. For example, as shown in FIG. 2, the control unit 400 may be electrically connected directly to the gate terminal G of the FET 300.

In addition, the control unit 400 may be configured to transmit a signal for controlling the opening/closing operation of the switch 10 to the FET 300. That is, in the configuration of FIG. 2, the control unit 400 may transmit an electric signal to the gate terminal G of the FET 300. In addition, the control unit 400 may transmit a signal for controlling the opening/closing operation of the switch 10 to the gate terminal G of the FET 300.

For example, the control unit 400 may apply a voltage of 0V to the gate terminal G of the FET 300 such that the FET 300 is in a closed state. In addition, the control unit 400 may apply a voltage of 5V to the gate terminal G of the FET 300 such that the FET 300 is in an open state. Here, 5V may be a threshold voltage of the FET 300.

For example, if 5V is applied to the gate terminal G of the FET 300 so that the FET 300 is open, the control unit 400 may close the FET 300 by applying 0V to the gate terminal G of the FET 300. In this case, since the source terminal S of the FET 300 and the drain terminal D of the FET 300 are electrically connected to each other, the input voltage may be transmitted from the voltage input source to the positive electrode terminal of the switch 10. Subsequently, switch 10 may be shifted to the closed state by receiving the input voltage.

In addition, if 0V is applied to the gate terminal G of the FET 300 so that the FET 300 is closed, the control unit 400 may open the FET 300 by applying 5V to the gate terminal G of the FET 300. In this case, since the source terminal S of the FET 300 and the drain terminal D of the FET 300 are electrically open, the input voltage may not be transmitted from the voltage input source to the positive electrode terminal of the switch 10. Subsequently, the switch 10 may be shifted to an open state.

The resistor 500 may be provided on a connection path between the control unit 400 and the path along which the power is supplied from the input terminal Vi of the voltage input source to the switch 10. For example, as shown in FIG. 2, the resistor 500 may be provided on a connection path that connects a second node N2 and the control unit 400. Here, the second node N2 may be provided on a path that connects the input terminal Vi and the positive electrode terminal of the switch 10 to each other. In addition, the second node N2 may be provided between the drain terminal D of the FET 300 and the first node N1.

In addition, the resistor 500 may be configured to distribute the voltage applied to control unit 400. For example, as shown in FIG. 2, a portion of the voltage applied between the second node N2 and the control unit 400 may be dividedly applied to the resistor 500. Through this configuration, the resistor 500 according to an embodiment of the present disclosure may prevent the voltage applied to the second node N2 from being entirely applied to the control unit 400.

Preferably, the control unit 400 according to an embodiment of the present disclosure may include at least two input/output pins i1, i2. Also, the input/output pins i1, i2 may be configured to be electrically connected directly to the FET 300 and the resistor 500, respectively. For example, as shown in FIG. 2, the first input/output pin i1 may be an input/output pin that connects the second node N2 and the control unit 400 to each other. In addition, the first input/output pin i1 may be an input/output pin that electrically connects the resistor 500 and the control unit 400 directly. In addition, the second input/output pin i2 may be an input/output pin that directly connects the gate terminal G of the FET 300 and the control unit 400 to each other. The control unit 400 may measure a potential of the drain terminal D of the FET 300 through the second input/output pin i2 to diagnose whether the FET 300 is disconnected or short-circuited.

Further, preferably, the resistor 500 according to an embodiment of the present disclosure may be configured such that both ends thereof are electrically connected directly between the first input/output pin i1 of the control unit 400 and a node between the drain terminal D of the FET 300 and the positive electrode terminal of the switch 10. For example, as shown in FIG. 2, the resistor 500 may be configured such that both ends thereof are electrically connected directly between the second node N2 and the first input/output pin i1 of the control unit 400.

Also, preferably, the Zener diode 200 according to an embodiment of the present disclosure may be connected in series to the freewheeling diode 100. For example, as shown in FIG. 2, the Zener diode 200 may be electrically connected directly between the ground G and the freewheeling diode 100.

Further, preferably, as shown in FIG. 2, in the FET 300 according to an embodiment of the present disclosure, the source terminal S of the FET 300 may be electrically connected directly to the input terminal Vi. In addition, in the FET 300, the drain terminal D of the FET 300 may be electrically connected to the positive electrode terminal of the switch 10 directly. Also, in the FET 300, the gate terminal G of the FET 300 may be electrically connected directly to the control unit 400.

Figure 3:
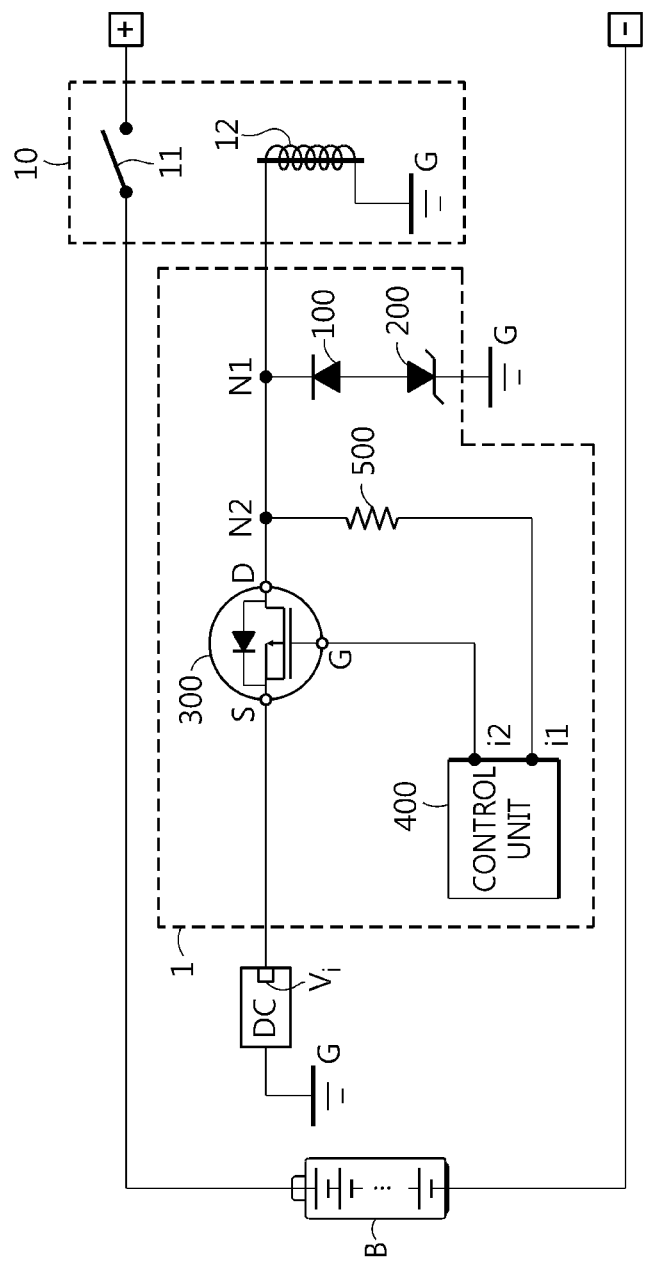
FIG. 3 is a diagram schematically showing a battery pack to which the switch control circuit according to an embodiment of the present disclosure is provided.

FIG. 3 is a diagram schematically showing a battery pack to which the switch control circuit according to an embodiment of the present disclosure is provided.

Referring to FIG. 3, the switch 10 shown in FIGS. 1 and 2 may include an iron piece 11 and an electromagnet 12. In addition, the input terminal Vi may be a terminal at which a current is output from the voltage input source DC. For example, the voltage input source DC may be a 12V lead storage battery.

The positive electrode terminals of the cell assembly B and the battery pack may be connected to the iron piece 11 provided at the switch 10, and the switch control circuit 1 may be connected to the electromagnet 12 provided at the switch 10. In addition, the other end of the electromagnet 12 may be connected to the ground G connected to the other end of the voltage input source DC. Here, the electromagnet 12 may include an iron core and a coil. Preferably, the coil may be wound around the iron core.

If a 0V voltage is applied to the gate terminal G of the FET 300, the source terminal S and the drain terminal D become electrically connected, and the current output from the input terminal Vi of the voltage input source DC may flow to the electromagnet 12. In this case, a magnetic field is formed at the electromagnet 12, and an iron piece 11 is moved due to the formed magnetic field, so that the switch 10 may be controlled to turn on. That is, if a 0V voltage is applied to the gate terminal G of the FET 300, the positive electrode terminal of the cell assembly B and the positive electrode terminal of the battery pack may be electrically connected.

If a voltage greater than the operating voltage is applied to the gate terminal G of the FET 300, the connection between the source terminal S and the drain terminal D may be disconnected. For example, when a voltage of 5V or above is applied to the gate terminal G, the connection between the source terminal S and the drain terminal D may be disconnected. In this case, a counter electromotive force may be generated due to the electromagnet 12. In this case, the ground G connected to the electromagnet 12 and the Zener diode 200 instantly has a higher potential than the potential of the electromagnet 12 connected to the first node N1, so that the current generated by the counter electromotive force may flow to the ground G. That is, the electromagnet 12, the ground G, the Zener diode 200 and the freewheeling diode 100 form a closed loop, and the current generated by the counter electromotive force may be quickly consumed while flowing through the formed closed loop. Also, for example, while the current generated by the counter electromotive force flows in the closed loop, −18 V may be applied to the first node N1 relative to ground G. The resistor 500 may consume some of the current flowing to control unit 400 such that the voltage applied to a first input/output pin i1 of the control unit 400 falls within a rated voltage range of the control unit 400.

That is, the switch control apparatus according to an embodiment of the present disclosure may quickly release and consume the current caused by a counter electromotive force generated based on the change in the operating state of the switch 10. In addition, the switch control apparatus may maintain the voltage applied to the control unit within the rated voltage. Thus, the stability of the switch control circuit may be further enhanced.

Meanwhile, the control unit 400 may be implemented to include a control unit 400, an application-specific integrated circuit (ASIC), another chipset, a logic circuit, a register, a communication modem, a data processing device, and/or a memory device, selectively.

Meanwhile, the memory device is not particularly limited as long as it serves as a storage medium capable of recording and erasing data. For example, the memory device may be a random access memory (RAM), a read only memory (ROM), a register, a hard disk, an optical recording medium, or a magnetic recording medium. The memory device also be electrically connected to the control unit 400, for example, via a data bus or the like so as to be accessed by the control unit 400. The memory device may also store and/or update and/or erase and/or transmit data generated when a program including various control logics performed in the control unit 400 and/or a control logic is executed.

Figure 4:
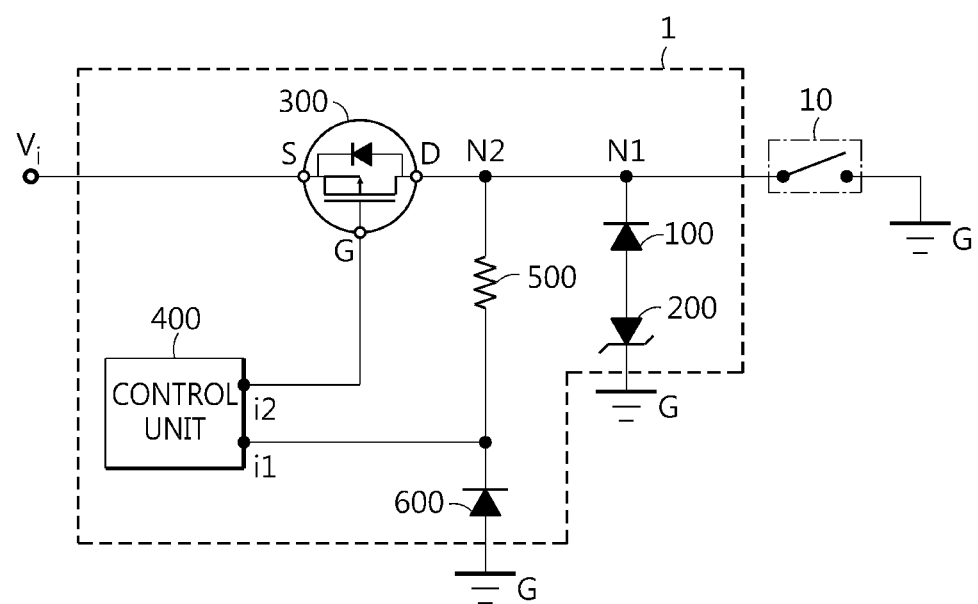
FIG. 4 is a diagram schematically showing that a switch control circuit according to another embodiment of the present disclosure is connected to a switch.

FIG. 4 is a diagram schematically showing that a switch control circuit according to another embodiment of the present disclosure is connected to a switch. In addition, in this embodiment, a feature to which the description of the former embodiment may be similarly applied will not be described, and description will be given focusing on different features.

Referring to FIG. 4, the control unit 400 and the resistor 500 according to an embodiment of the present disclosure may be electrically connected directly at a node provided between the control unit 400 and the resistor 500.

Preferably, as shown in FIG. 4, the switch control apparatus according to an embodiment of the present disclosure may further include a reverse voltage protection diode 600.

The reverse voltage protection diode 600 may be connected to the node provided between the control unit 400 and the resistor 500.

Preferably, the reverse voltage protection diode 600 may be configured so that a forward direction thereof is a direction toward the resistor 500. For example, as shown in FIG. 4, the reverse voltage protection diode 600 may be electrically connected directly between the ground G and the node provided between the control unit 400 and the resistor 500. In addition, as shown in FIG. 4, the reverse voltage protection diode 600 may be configured such that the forward direction is a direction toward the node provided between the control unit 400 and the resistor 500.

The switch control apparatus according to the present disclosure may be applied to a battery management system (BMS). That is, the BMS according to the present disclosure may include the switch control apparatus of the present disclosure as described above. In this configuration, at least a part of the components of the switch control apparatus according to the present disclosure may be implemented by supplementing or adding functionality of components included in the conventional BMS. For example, the control unit 400 and the memory device of the switch control apparatus according to the present disclosure may be implemented as components of the BMS.

Figure 5:
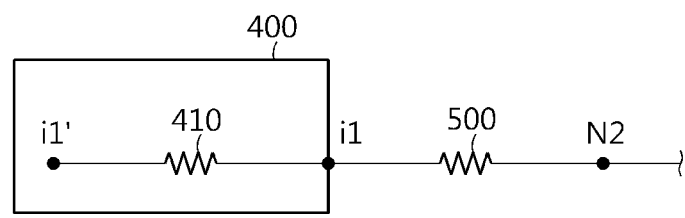
FIG. 5 is a diagram schematically showing a resistor connected between a control unit according to an embodiment of the present disclosure and a switch.

In addition, the switch control apparatus according to the present disclosure may be provided to a battery pack. That is, the battery pack according to the present disclosure may include the switch control apparatus according to the present disclosure. Here, the battery pack may include at least one secondary battery, the switch control apparatus, electrical components (such as a BMS, a relay and a fuse), a case, and so on. FIG. 5 is a diagram schematically showing a resistor connected between a control unit according to an embodiment of the present disclosure and a switch.

Referring to FIGS. 2 to 5, the resistor 500 according to an embodiment of the present disclosure may be provided between the second node N2 and the first input/output pin i1 of the control unit 400.

The control unit 400 according to an embodiment of the present disclosure may include an internal resistor 410, as shown in FIG. 5.

The internal resistor 410 may be provided between the first input/output pin i1 and an internal terminal i1'. For example, the internal resistor 410 may be an equivalent resistor to resistor 500 of the control unit 400.

Preferably, the resistor 500 according to an embodiment of the present disclosure may be configured such that the voltage applied to the first input/output pin i1 of the control unit 400 is applied within the rated voltage of the control unit 400. For example, as shown in FIG. 5, if the voltage applied between the internal terminal i1' and the second node N2 is 18V and the internal resistor 410 and the resistor 500 have the same resistance of 1 kΩ, 18V may be distributed to the internal resistor 410 and the resistor 500, namely 9V for each. In this case, if −18V is applied to the second node N2, −9V may be applied to the first input/output pin i1. For example, if the rated voltage of the control unit 400 is −10V to 60V, a voltage of −10V to 60V should be applied to the first input/output pin i1 of the control unit 400. Thus, through this configuration, the resistor 500 according to an embodiment of the present disclosure may distribute the voltage applied to the second node N2 so that the voltage applied to the input/output pin of the control unit 400 falls with the rated voltage of the control unit 400.

More preferably, the resistor 500 according to an embodiment of the present disclosure may have a resistance greater than or equal to the resistance of the internal resistor of the control unit 400. Even when the resistance of the resistor 500 is greater than or equal to the resistance of the internal resistor 410, a voltage corresponding to the rated voltage of the control unit 400 may be stably applied to the first input/output pin i1. For example, if −18V is applied to the second node N2, the resistance of the resistor 500 is 21a and the resistance of the internal resistor 410 is 1 kΩ, −6V may be applied to the first input/output pin i1.

Through this configuration, the switch control apparatus according to an embodiment of the present disclosure quickly releases the current by the counter electromotive force generated when the switch is shifted from the closed state to the open state and allows the voltage applied to the control unit to be applied within the rated voltage. In this way, it is possible to prevent devices such as an integrated circuit (IC) chip provided in the control unit from being damaged.

In addition, there is no particular limitation on the types of various control logics of the control unit, as long as one or more control logics are combined and the combined control logic is written in a computer-readable code system so that the computer-readable access is possible. As one example, the recording medium includes at least one selected from the group consisting of a ROM, a RAM, a register, a CD-ROM, a magnetic tape, a hard disk, a floppy disk and an optical data recording device. In addition, the code system may be stored and executed in a distributed manner on computers connected through a network. Moreover, functional programs, code and segments for implementing the combined control logics may be easily inferred by programmers in the technical field to which the present disclosure belongs.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Meanwhile, in this specification, the term 'unit' is used, such as 'control unit'. However, it will be apparent to those skilled in the art that these terms just represent logical configuration units and are not intended to represent components that are physically separable or must be physically separated.

REFERENCE SIGNS

1: switch control circuit
10: switch
100: freewheeling diode
200: Zener diode
300: FET
400: control unit
410: internal resistor
500: resistor
600: reverse voltage protection diode
B: cell assembly
L: load
DC: voltage input source

What is claimed is:

1. A switch control apparatus for controlling an opening/closing operation of a switch supplied with a power from a voltage input source, the switch control apparatus comprising:
 a freewheeling diode electrically connected to the switch in parallel so that a current flows toward a positive electrode terminal of the switch;
 a Zener diode electrically connected to the freewheeling diode in series;
 a field effect transistor (FET) provided between an input terminal of the voltage input source and a positive electrode terminal of the switch and configured to receive an input voltage from the input terminal and transmit the input voltage to the positive electrode terminal of the switch;

a control unit electrically connected to the FET to transmit a signal to the FET for controlling an opening/closing operation of the switch; and a resistor provided on a connection path between the control unit and the path along which the input voltage is supplied from the input terminal of the voltage input source to the switch, to distribute a voltage applied to the control unit.

2. The switch control apparatus according to claim 1, wherein the resistor is electrically connected directly between a first input/output pin of the control unit and a node between a drain terminal of the FET and the positive electrode terminal of the switch.

3. The switch control apparatus according to claim 2, wherein the resistor has a resistance so that a voltage applied to the first input/output pin of the control unit falls within a rated voltage range of the control unit.

4. The switch control apparatus according to claim 3, wherein the resistance of the resistor is greater than or equal to an internal resistance of the control unit.

5. The switch control apparatus according to claim 1, wherein the Zener diode is configured so that a forward direction thereof is opposite to a forward direction of the freewheeling diode.

6. The switch control apparatus according to claim 1, wherein the FET is configured such that a source terminal of the FET is electrically connected to the input terminal directly, a drain terminal of the FET is electrically connected to the positive electrode terminal of the switch directly, and a gate terminal of the FET is electrically connected to the control unit directly.

7. The switch control apparatus according to claim 1, wherein the control unit includes at least two input/output pins, and wherein the input/output pins are electrically connected directly to the FET and the resistor, respectively.

8. The switch control apparatus according to claim 1, further comprising:

a reverse voltage protection diode connected between the control unit and the resistor and configured so that a forward direction thereof is a direction toward the resistor.

9. A battery management system (BMS), comprising the switch control apparatus according to claim 1.

10. A battery pack, comprising the switch control apparatus according to claim 1.

* * * * *